(12) United States Patent
Killen et al.

(10) Patent No.: US 6,700,463 B2
(45) Date of Patent: Mar. 2, 2004

(54) TRANSMISSION LINE STRUCTURE FOR REDUCED COUPLING OF SIGNALS BETWEEN CIRCUIT ELEMENTS ON A CIRCUIT BOARD

(75) Inventors: William D. Killen, Melbourne, FL (US); Randy T. Pike, Grant, FL (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 10/185,570

(22) Filed: Jun. 27, 2002

(65) Prior Publication Data

US 2004/0000977 A1 Jan. 1, 2004

(51) Int. Cl.[7] .................................................. H01P 3/08
(52) U.S. Cl. ....................................... 333/238; 333/236
(58) Field of Search ................................. 333/236, 238, 333/245, 246, 247

(56) References Cited

U.S. PATENT DOCUMENTS

| | | |
|---|---|---|
| 3,571,722 A | 3/1971 | Vendelin |
| 3,678,418 A | 7/1972 | Woodward |
| 4,495,505 A | 1/1985 | Shields |
| 4,525,720 A | 6/1985 | Corzine et al. |
| 4,800,344 A | 1/1989 | Graham |
| 4,825,220 A | 4/1989 | Edward et al. |
| 4,882,553 A | 11/1989 | Davies et al. |
| 4,916,410 A | 4/1990 | Littlefield |
| 4,924,236 A | 5/1990 | Schuss et al. |
| 5,039,891 A | 8/1991 | Wen et al. |
| 5,148,130 A | 9/1992 | Dietrich |
| 5,379,006 A | 1/1995 | McCorkle |
| 5,455,545 A | 10/1995 | Garcia |
| 5,523,728 A | 6/1996 | McCorkle |
| 5,678,219 A | 10/1997 | Agarwal et al. |
| 6,052,039 A | 4/2000 | Chiou et al. |
| 6,114,940 A | 9/2000 | Kakinuma et al. |
| 6,133,806 A | 10/2000 | Sheen |
| 6,137,376 A | 10/2000 | Imbornone et al. |
| 6,184,845 B1 | 2/2001 | Leisten et al. |
| 6,307,509 B1 | 10/2001 | Krantz |

*Primary Examiner*—Don Le
(74) *Attorney, Agent, or Firm*—Sacco & Associates, P.A.

(57) ABSTRACT

A transmission line structure for reduced coupling of signals between circuit elements. The structure includes an RF transmission line disposed on a circuit board (100) formed from a dielectric substrate material. The RF transmission line includes an elongated conductive metal trace (110) and has opposed elongated edge portions. The structure also includes a pair of elongated substrate boundary regions (105) coextensive with at least a portion of the elongated conductive metal trace (110). Each of the boundary regions (105) is positioned adjacent to a respective one of the opposing edge portions to define an elongated substrate channel region (205). A pair of conductive metal traces (410) can be disposed on the substrate channel region (205) within the substrate boundary regions (105). The conductive metal traces (410) are spaced apart by an intermediate substrate region (405) and are parallel to each other. The intermediate region (405) has a different permittivity than a permittivity of the substrate channel region (205).

8 Claims, 2 Drawing Sheets

TRANSMISSION LINE STRUCTURE FOR REDUCED COUPLING OF SIGNALS BETWEEN CIRCUIT ELEMENTS ON A CIRCUIT BOARD

BACKGROUND OF THE INVENTION

1. Statement of the Technical Field

The inventive arrangements relate generally to methods and apparatus for providing increased design flexibility for RF circuits, and more particularly for optimization of dielectric circuit board materials for improved circuit performance.

2. Description of the Related Art

Transmission lines and radiating elements are commonly manufactured on specially designed substrate boards. For the purposes of these types of circuits, it is important to maintain careful control over impedance characteristics and coupling between lines. If the impedance of different parts of the circuit do not match, this can result in inefficient power transfer, unnecessary heating of components, and other problems. Coupling between lines can cause cross talk, electromagnetic interference (EMI), and adversely affect performance of the circuits Printed transmission lines, passive RF devices, and radiating elements used in RF circuits are typically formed in one of three ways. One configuration known as microstrip, places the signal line on a board surface and provides a second conductive layer, commonly referred to as a ground plane. A second type of configuration known as buried microstrip is similar except that the signal line is covered with a dielectric substrate material. In a third configuration known as stripline, the signal line is sandwiched between two electrically conductive (ground) planes.

Via structures are commonly used in multilayered circuit boards to connect between different circuit board layers. Vias are typically oriented perpendicularly to the circuit board surface. Vias are sometimes strategically located on printed circuit boards between transmission lines to minimize RF coupling between the traces.

Further, conventional circuit board substrates are generally formed by processes such as casting or spray coating which generally result in uniform substrate physical properties, including the permittivity. Vias then are formed in the circuit board substrates after the casting or spraying step. Hence, manufacturing circuit boards with via structures is costly. Accordingly, via structure implementation has proven to be a limitation in designing circuits that are optimal in regards to both electrical characteristics and cost efficiency.

SUMMARY OF THE INVENTION

The present invention relates to a transmission line structure for reduced coupling of signals between circuit elements on a circuit board. The structure includes an RF transmission line disposed on a circuit board formed from a dielectric substrate material. The RF transmission line includes at least one elongated conductive metal trace having opposed elongated edge portions. The conductive metal trace and the substrate material are dimensioned for transverse electromagnetic wave propagation along the conductive metal trace at a selected frequency.

The structure also includes a pair of elongated substrate boundary regions. The substrate boundary regions are coextensive with at least a portion of the elongated conductive metal trace. Each of the boundary regions is positioned adjacent to a respective one of the opposing edge portions, defining an elongated substrate channel region. The substrate boundary regions define a transition from a first set of substrate characteristics to a second set of substrate characteristics wherein propagation of electromagnetic energy from the channel region to other portions of the circuit board is reduced by the presence of the boundary regions. For example, the permittivity of the substrate channel region can be smaller as compared to a permittivity of the dielectric substrate material surrounding the substrate channel region on an opposing side of the boundary region.

The transmission line structure can further include a pair of conductive metal traces disposed on the substrate channel region within the substrate boundary regions. The conductive metal traces are spaced apart and parallel to each other. An intermediate substrate region can be disposed between the pair of conductive metal traces. In one embodiment, a portion of each of the conductive traces is respectively disposed on an opposing face of the intermediate substrate region. The intermediate region has a permittivity different as compared to a permittivity of the substrate channel region. Optionally, the intermediate substrate region can extend through only a portion of a thickness of the circuit board on which the conductive metal traces are disposed.

DETAILED DESCRIPTION OF THE PREFERRED EMBODIMENTS

Low dielectric constant board materials are ordinarily selected for RF designs. For example, polytetrafluoroethylene (PTFE) based composites such as RT/duroid ® 6002 (dielectric constant of 2.94; loss tangent of 0.009) and RT/duroid ® 5880 (dielectric constant of 2.2; loss tangent of 0.0007) are both available from Rogers Microwave Products, Advanced Circuit Materials Division, 100 S. Roosevelt Ave, Chandler, Ariz. 85226. Both of these materials are common board material choices. The above board materials provide circuit board dielectric layers having relatively low dielectric constants with accompanying low loss tangents.

However, use of conventional board materials can compromise some performance aspects of circuits that can benefit from high dielectric constant layers. By comparison, the present invention provides a circuit designer with an added level of flexibility in circuit board design by permitting the use of high permeability and permittivity regions within a circuit board substrate. The permeability and permittivity in various regions of the substrate can be optimized for controlling circuit impedance and creating a dielectric channel region about a transmission line. A channel region is a region in a substrate that is separated from at least one other substrate region by a boundary region that reflects or absorbs propagated signals. For example, a channel region can be determined by a boundary region separating a substrate region having a first dielectric characteristic from a region having a second dielectric characteristic. A channel region can be bounded on one or more sides or, in one embodiment, completely bounded on all sides.

The channel region and associated boundary region reduces coupling between the transmission line and other circuit components. The channel region further provides the added benefit of attenuating higher order waveguide modes within the circuit board substrate.

Figure 1:
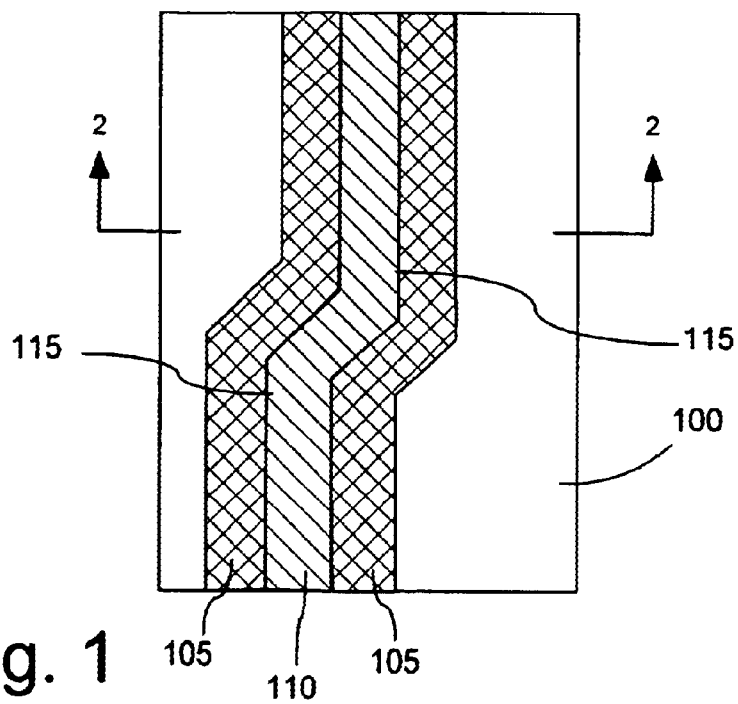
FIG. 1 is a top view of a transmission line structure implementing a dielectric bounded region in accordance with the present invention.

Referring to FIG. 1, a circuit board 100 is provided. The circuit board 100 is formed from a dielectric substrate material and incorporates a channel region about a transmission line 110. The transmission line 110 is disposed on the circuit board 100 and comprises at least one elongated conductive metal trace having opposed elongated edge portions 115. As used herein, the term "disposed on" means coupled on top, on a side, underneath, or within. For example, "disposed on" embodies microstrip, buried microstrip and stripline circuit configurations. At least two side substrate regions (side regions) 105 bounding opposing sides of the transmission line 110 are provided within the circuit board 100.

Figure 2:
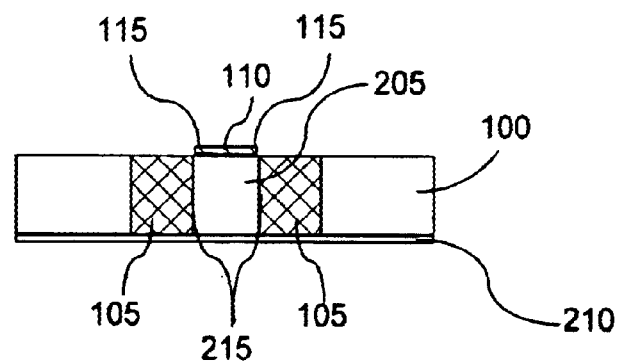
FIG. 2 is a cross-sectional view of the transmission line structure of FIG. 1 taken along line 2—2.

Referring to FIG. 2, a sectional view of the circuit board 100 is shown, the sectional view being taken along section line 2—2 of FIG. 1. An elongated substrate channel region (channel region) 205 Is positioned under the transmission line 110 and between opposing side regions 105. The junctions of the channel region 205 with the side regions 105 define boundary regions 215, which are a transition from the channel region 205 to each of the side regions 105. Notably, the substrate properties of the channel region 205 differ from substrate properties in the side regions 105. For example, the channel region 205 can have a permeability and/or a permittivity that is different from the permeability and/or permittivity of the side regions 105.

Further, a ground plane 210 is preferably disposed on the circuit board 100 beneath the channel region 205. Accordingly, the channel region 205 is defined by the transmission line 110 on a first side, the ground plane 210 on a second side, and boundary regions 215 on third and fourth sides.

Generally, the channel region 205 supports transverse electro-magnetic wave (TEM wave) propagation along its length. To create the channel region 205, the side regions 105 can be formed to result in the regions having different impedances and wave propagation velocities. The differences in impedances and wave propagation velocities can be exploited to reflect and contain signal energy within the channel region 205, as is explained in further detail below. The amount signal energy propagating from the transmission line 110 and coupling to other circuit components can therefore be reduced.

In general, the propagation velocity of a signal traveling through a substrate is equal to where $c/\sqrt{\mu_r \epsilon_r}$, where $\mu_r$ is the relative permeability of the substrate and $\epsilon_r$ is the relative permittivity of the substrate. Accordingly, the permeability and/or permittivity in the channel 205 and side regions 105 can be controlled to achieve different propagation velocities for the respective regions, thus creating a boundary condition at each boundary region 215. The boundary condition causes a certain amount of reflection of RF signals that have an angle of incidence greater than zero. Hence, a portion of energy contained in RF signals propagating to the boundary regions 215 from within the channel region 205 will be reflected back into the channel region 205.

Moreover, the characteristic impedance of a substrate is proportional to $\sqrt{\mu_r/\epsilon_r}$. Thus, the relative permeability and the relative permittivity of the channel region 205 and side regions 105 also can be controlled to create an impedance mismatch between the channel region 205 and the side region 105. The impedance mismatch will also cause a portion of signals transmitted to boundary regions 215 from within the channel region to be reflected, even those signals perpendicular to the boundary region 215. Thus, a portion of signal energy propagating into the channel region 205 from the transmission line 110 can be contained within the channel region 205. For example, the TEM wave can propagate along the transmission line 110, the ground 210 and the boundary regions 215 that the define sides of the channel region.

The substrate in the side regions 105 can be adjusted to further tailor the channel region performance. For example, the permeability and/or permittivity in the side regions 105 can be differentially modified so that the channel region 205 exhibits low loss at a fundamental frequency, but attenuates the higher order modes. Significantly, higher order odd modes can be reduced.

A further advantage to transmission line performance results from increasing the permeability and/or permittivity of the substrate in the side regions 105. The permeability and permittivity can be optimized to provide a low reluctance path for electric fields and magnetic fields between the transmission line 110 and the ground 210. The low reluctance path reduces fringing of the fields and further reduces the unwanted propagation of energy from the transmission line 110.

Further, having a difference in permeability and/or permittivity between the channel region 205 and the side regions 105 can facilitate maintaining electromagnetic wave propagations within the channel region 205. The mechanism is based on Snell's Law of Refraction. When an electromagnetic wave is incident upon a boundary between two regions having different permeability and/or permittivity, a substantial portion of the energy contained in an electromagnetic wave is reflected away from the boundary. In some instances, all of the electromagnetic energy is reflected. Accordingly, the boundary between the channel region 205 and the side regions 105 can be designed with appropriate selection of material properties to result in electromagnetic waves that are propagated within the channel region 205 being contained within the channel region 205. Hence, electromagnetic energy is kept virtually completely between the conductor and the ground plane and little or no energy couples to other nearby transmission lines.

Figure 3:
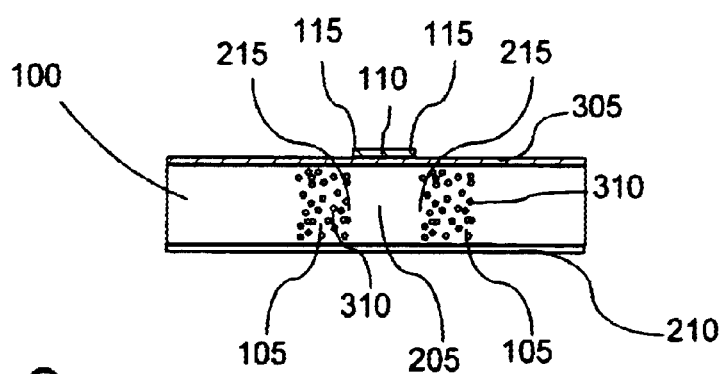
FIG. 3 is a cross-sectional view of an alternate embodiment of the transmission line structure of FIG. 1 taken along line 2—2.

According to one embodiment shown in FIG. 3, a supplemental dielectric layer 305 can be added to circuit board 100. Techniques known in the art such as various spray technologies, spin-on technologies, various deposition technologies or sputtering can be used to apply the supplemental layer. The supplemental dielectric layer can provide control over impedance characteristics near the surface of the circuit board. Further, magnetic particles 310 can be added to the side regions 105 to provide a means for changing the relative permeability in the side regions. For example, diamagnetic or ferromagnetic particles can be added to the side region 105. Notably, magnetic particles can be added to other circuit board regions as well.

Figure 4:
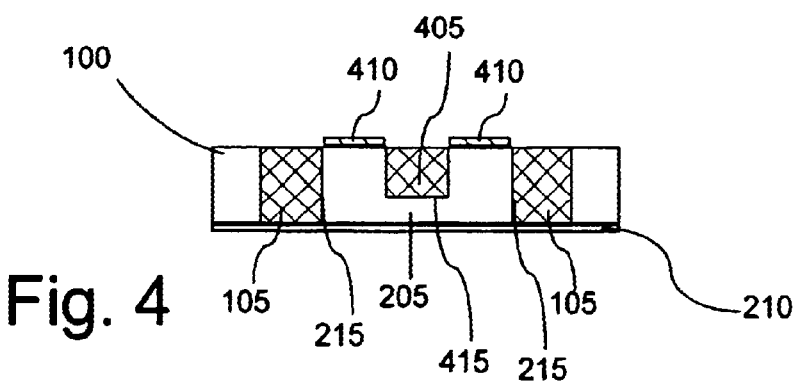
FIG. 4 is a cross-sectional view of an embodiment of the transmission line structure incorporating two transmission lines in accordance with the present invention.

The present invention also can be applicable to other circuit configurations, for example, to a plurality of transmission lines. A twin line configuration is shown in FIG. 4 wherein substrate regions are adjusted to provide a channel region about two transmission lines 410. The pair of transmission lines 410 is positioned between relative locations of the two side regions 105. An intermediate substrate region 405 having a different permittivity and/or permeability than the channel region 205 can be positioned between the transmission lines 410. The intermediate substrate region 405 can extend into the channel region 205 from the upper surface of the circuit board 100. Accordingly, a channel region is defined in that case by the transmission lines 410, the ground plane 210, boundary regions 215, and the boundary region 415 between the substrate channel and intermediate substrate regions 205 and 405.

Importantly, the intermediate substrate region 405 need not extend all the way down to the ground plane 210 to complete the channel region 205. Nevertheless, if the intermediate region 405 is configured to extend to the ground plane 210, two smaller channel regions are created. Accordingly, the channel region characteristics of the smaller bounded regions will change, as would be known to one skilled in the art of controlling TEM waves. For example, channel regions with a smaller cross section will exhibit a higher cutoff frequency than channel regions of equivalent length with a larger cross section.

A further advantage provided by the intermediate substrate region 405 is control of the permittivity and/or permeability between the two transmission lines 410. The permittivity and/or permeability can be adjusted to provide desired impedance characteristics between the lines 410 (odd mode or differential mode impedance). For example, the permittivity can be increased to increase the capacitance between the two transmission lines. Additionally, the permeability and/or permittivity of the intermediate substrate region 405 can be adjusted in concert with the side regions 105 to control the impedance between the transmission lines 410 and the ground plane 210 (even mode or common mode impedance). For example, the permittivity of the channel region 205, side regions 105 and intermediate regions 405 can be adjusted to control the capacitance between the transmission lines 410 and the ground 210. Moreover, the permeabilities of the channel, side and intermediate regions can be chosen to achieve desired inductance values associated with the transmission lines 410. Notably, the capacitance and inductance values can be controlled so that the transmission line impedances closely match selected load impedances.

The flexibility to adjust transmission line impedances as discussed herein is extremely beneficial in RF applications. A good impedance match from the transmission lines to the load maintains a low VSWR and favorable port isolation, which result in better signal transfer to a load. Further, a good impedance match also reduces an amount of unwanted signal reflection in RF circuits. As is commonly known, signal reflection in RF circuits can result in overheating of circuit components, improper voltage characteristics, and other undesirable circuit conditions.

Figure 5:
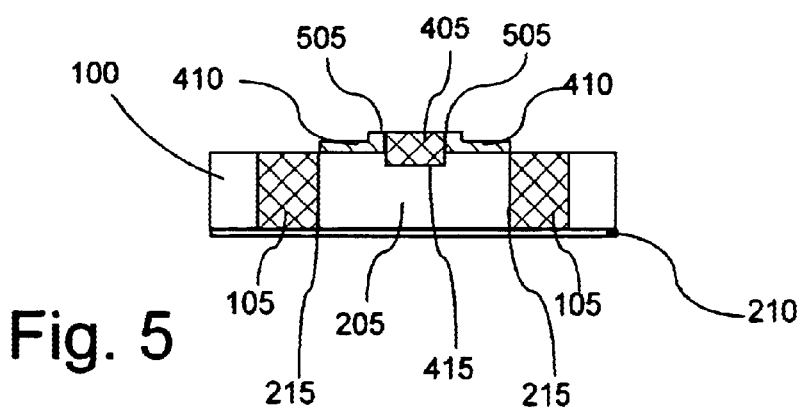
FIG. 5 is a cross-sectional view of an alternate embodiment of the transmission line structure incorporating two transmission lines in accordance with the present invention.

Referring to FIG. 5, an alternative embodiment is presented wherein the intermediate region 405 extends above the surface of the circuit board 100. In this embodiment the intermediate region 405 provides a surface contour which can be utilized to form opposing vertical faces 505 on the transmission lines 410. The vertical faces 505, add an additional element to the transmission line structure which can be controlled to adjust capacitance between the transmission lines 410.

The permittivity and/or permeability of selected regions of the circuit board 100 can be differentially modified to optimize circuit performance. The term "differential modifying" as used herein refers to any modifications, including additions, to the circuit board 100 that result in at least one of the dielectric and magnetic properties being different at one region of the substrate as compared to another region. For example, the modification can be a selective modification where certain circuit board regions are modified to produce a specific dielectric or magnetic properties, while other circuit board regions are left unmodified.

In yet other embodiments, substrate regions under transmission lines can be controlled to achieve certain transmission line characteristics. Further, the dimensions and shape of the substrate regions also can be controlled to influence electric and magnetic field line patterns. For example, the substrate regions can have oval cross sections, rectangular cross sections, and other cross sections having both uniform and non-uniform shapes.

Figure 6:
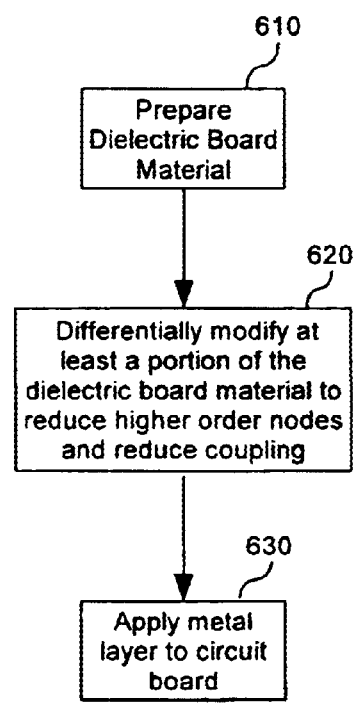
FIG. 6 is a flow chart that is useful for illustrating a process for manufacturing a transmission line structure having a dielectric bounded region in accordance with the present invention.

A method for providing a dielectric bounded region about a transmission line is described with reference to the text below and the flow chart presented in FIG. 6. In step 610, board dielectric material is prepared for modification. As previously noted, the board material can include commercially available off the shelf board material or customized board material formed from a polymer material, or some combination thereof. The preparation process can be made dependent upon the type of board material selected.

In step 620, one or more circuit board regions, such as the channel, side and intermediate regions can be differentially modified so that the permittivity and/or permeability differ between two or more portions of the regions. The differential modification can be accomplished in several different ways, as previously described. Referring to step 630, the metal layer then can be applied to form the transmission lines using standard circuit board techniques known in the art.

Dielectric substrate boards having meta-material regions providing localized and selectable magnetic and substrate properties can be prepared in the following manner. As defined herein, the term "meta-materials" refers to composite materials formed from the mixing or arrangement of two or more different materials at a very fine level, such as the molecular or nanometer level. Meta-materials allow tailoring of electromagnetic properties of the composite, which can be defined by effective electromagnetic parameters comprising effective electrical permittivity (or permittivity) and the effective magnetic permeability.

Appropriate bulk dielectric substrate materials can be obtained from commercial materials manufacturers, such as DuPont and Ferro. The unprocessed material, commonly called Green Tape™, can be cut into sized regions from a bulk dielectric tape, such as into 6 inch by 6 inch regions. For example, DuPont Microcircuit Materials provides Green Tape material systems, such as 951 Low-Temperature Cofire Dielectric Tape and Ferro Electronic Materials ULF28-30 Ultra Low Fire COG dielectric formulation. These substrate materials can be used to provide circuit boards having relatively moderate permittivities with accompanying relatively low loss tangents for circuit operation at microwave frequencies once fired.

In the process of creating a microwave circuit using multiple sheets of dielectric substrate material, features such as vias, voids, holes, or cavities can be punched through one or more layers of tape. Voids can be defined using mechanical means (e.g. punch) or directed energy means (e.g., laser drilling, photolithography), but voids can also be defined using any other suitable method. Some vias can reach through the entire thickness of the sized substrate, while some voids can reach only through varying regions of the substrate thickness.

The vias can then be filled with metal or other dielectric or magnetic materials, or mixtures thereof, usually using stencils for precise placement of the backfill materials. The individual layers of tape can be stacked together in a conventional process to produce a complete, multi-layer substrate. Alternatively, individual layers of tape can be stacked together to produce an incomplete, multi-layer substrate generally referred to as a sub-stack.

Voided regions can also remain voids. If backfilled with selected materials, the selected materials preferably include meta-materials. The choice of a meta-material composition can provide tunable effective dielectric constants over a relatively continuous range from less than 2 to about 2650. Tunable magnetic properties are also available from certain meta-materials. For example, through choice of suitable materials the relative effective magnetic permeability generally can range from about 4 to 116 for most practical RF applications. However, the relative effective magnetic permeability can be as low as about 2 or reach into the thousands.

The term "differentially modified" as used herein refers to modifications, including dopants, to a dielectric circuit board that result in at least one of the dielectric and magnetic properties being different at one region of the substrate as compared to another region. A differentially modified board substrate preferably includes one or more meta-material containing regions.

For example, the modification can be selective modification where certain circuit board regions are modified to produce a first set of dielectric or magnetic properties, while other circuit board regions are modified differentially or left unmodified to provide dielectric and/or magnetic properties different from the first set of properties. Differential modification can be accomplished in a variety of different ways.

According to one embodiment, a supplemental dielectric layer can be added to the circuit board. Techniques known in the art such as various spray technologies, spin-on technologies, various deposition technologies or sputtering can be used to apply the supplemental dielectric layer. The supplemental dielectric layer can be selectively added in localized regions, including inside voids or holes, or over the entire existing circuit board. For example, a supplemental dielectric layer can be used for providing a substrate region having an increased effective dielectric constant. The dielectric material added as a supplemental layer can include various polymeric materials.

The differential modifying step can further include locally adding additional material to the circuit board or supplemental dielectric layer. The addition of material can be used to further control the effective dielectric constant or magnetic properties of the circuit board to achieve a given design objective.

The additional material can include a plurality of metallic and/or ceramic particles. Metal particles preferably include iron, tungsten, cobalt, vanadium, manganese, certain rare-earth metals, nickel or niobium particles. The particles are preferably nanosize particles, generally having sub-micron physical dimensions, hereafter referred to as nanoparticles.

The particles, such as nanoparticles, can preferably be organofunctionalized composite particles. For example, organofunctionalized composite particles can include particles having metallic cores with electrically insulating coatings or electrically insulating cores with a metallic coating.

Magnetic meta-material particles that are generally suitable for controlling magnetic properties of circuit board for a variety of applications described herein include ferrite organoceramics (FexCyHz)-(Ca/Sr/Ba-Ceramic). These particles work well for applications in the frequency range of 8–40 GHz. Alternatively, or in addition thereto, niobium organoceramics (NbCyHz)-(Ca/Sr/BaCeramic) are useful for the frequency range of 12–40 GHz. The materials designated for high frequency are also applicable to low frequency applications. These and other types of composite particles can be obtained commercially.

In general, coated particles are preferable for use with the present invention as they can aid in binding with a polymer matrix or side chain moiety. In addition to controlling the magnetic properties of the dielectric, the added particles can also be used to control the effective dielectric constant of the material. Using a fill ratio of composite particles from approximately 1 to 70%, it is possible to raise and possibly lower the dielectric constant of circuit board and/or supplemental circuit board regions significantly. For example, adding organofunctionalized nanoparticles to a circuit board can be used to raise the dielectric constant of the modified circuit board regions.

Particles can be applied by a variety of techniques including polyblending, mixing and filling with agitation. For example, a dielectric constant may be raised from a value of 2 to as high as 10 by using a variety of particles with a fill ratio of up to about 70%. Metal oxides useful for this purpose can include aluminum oxide, calcium oxide, magnesium oxide, nickel oxide, zirconium oxide and niobium (II, IV and V) oxide. Lithium niobate ($LiNbO_3$), and zirconates, such as calcium zirconate and magnesium zirconate, also may be used.

The selectable substrate properties can be localized to areas as small as about 10 nanometers, or cover large area regions, including the entire board substrate surface. Conventional techniques such as lithography and etching along with deposition processing can be used for localized dielectric and magnetic property manipulation.

Materials can be prepared mixed with other materials or including varying densities of voided regions (which generally introduce air) to produce effective dielectric constants in a substantially continuous range from 2 to about 2650, as well as other potentially desired substrate properties. For example, materials exhibiting a low dielectric constant (<2 to about 4) include silica with varying densities of voided regions. Alumina with varying densities of voided regions can provide a dielectric constant of about 4 to 9. Neither silica nor alumina have any significant magnetic permeability. However, magnetic particles can be added, such as up to 20 wt. %, to render these or any other material significantly magnetic. For example, magnetic properties may be tailored with organofunctionality. The impact on dielectric constant from adding magnetic materials generally results in an increase in the dielectric constant.

Medium dielectric constant materials have a dielectric constant generally in the range of 70 to 500 +/−10%. As noted above these materials may be mixed with other materials or voids to provide desired effective dielectric constant values. These materials can include ferrite doped calcium titanate. Doping metals can include magnesium, strontium and niobium. These materials have a range of 45 to 600 in relative magnetic permeability.

For high dielectric constant applications, ferrite or niobium doped calcium or barium titanate zirconates can be used. These materials have a dielectric constant of about 2200 to 2650. Doping percentages for these materials are generally from about 1 to 10%. As noted with respect to other materials, these materials may be mixed with other materials or voids to provide desired effective dielectric constant values.

These materials can generally be modified through various molecular modification processing. Modification processing can include void creation followed by filling with materials such as carbon and fluorine based organo functional materials, such as polytetrafluoroethylene PTFE.

Alternatively or in addition to organofunctional integration, processing can include solid freeform fabrication (SFF), photo, uv, x-ray, e-beam or ion-beam irradiation. Lithography can also be performed using photo, uv, x-ray, e-beam or ion-beam radiation.

Different materials, including meta-materials, can be applied to different areas on circuit boards (sub-stacks), so that a plurality of areas of the circuit boards (sub-stacks) have different dielectric and/or magnetic properties. The backfill materials, such as noted above, may be used in conjunction with one or more additional processing steps to attain desired, dielectric and/or magnetic properties, either locally or over a bulk substrate region.

A top layer conductor print is then generally applied to the modified circuit board, sub-stack, or complete stack. Conductor traces can be provided using thin film techniques, thick film techniques, electroplating or any other suitable technique. The processes used to define the conductor pattern include, but are not limited to standard lithography and stencil.

A base plate is then generally obtained for collating and aligning a plurality of modified board substrates. Alignment holes through each of the plurality of substrate boards can be used for this purpose.

The plurality of layers of substrate, one or more sub-stacks, or combination of layers and sub-stacks can then be laminated (e.g. mechanically pressed) together using either isostatic pressure, which puts pressure on the material from all directions, or uniaxial pressure, which puts pressure on the material from only one direction. The laminate substrate is then further processed as described above or placed into an oven to be fired to a temperature suitable for the processed substrate (approximately 850 C. to 900 C. for the materials cited above).

The plurality of ceramic tape layers and stacked sub-stacks of substrates can then be fired, using a suitable furnace that can be controlled to rise in temperature at a rate suitable for the substrate materials used. The process conditions used, such as the rate of increase in temperature, final temperature, cool down profile, and any necessary holds, are selected mindful of the substrate material and any material backfilled therein or deposited thereon. Following firing, stacked substrate boards, typically, are inspected for flaws using an optical microscope.

The stacked ceramic substrates can then be optionally diced into cingulated pieces as small as required to meet circuit functional requirements. Following final inspection, the cingulated substrate pieces can then be mounted to a test fixture for evaluation of their various characteristics, such as to assure that the dielectric, magnetic and/or electrical characteristics are within specified limits.

Thus, dielectric substrate materials can be provided with localized tunable dielectric and/or magnetic characteristics for creating a dielectric bounded region about a transmission line, wherein the dielectric bounded region is contained within a circuit board substrate. The dielectric flexibility allows independent optimization of circuit elements.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as described in the claims.

What is claimed is:

1. A transmission line structure for reduced coupling of signals between circuit elements on a circuit board, comprising:

a circuit board formed from a dielectric substrate material;

an RF transmission line disposed on said circuit board, said RF transmission line comprising at least one elongated conductive metal trace having opposed elongated edge portions;

a pair of elongated substrate boundary regions, said substrate boundary regions coextensive with at least a portion of said at least one elongated conductive metal trace, each of said boundary regions positioned adjacent to a respective one of said opposing edge portions to define an elongated substrate channel region;

said substrate boundary regions defining a transition from a first set of substrate characteristics to a second set of substrate characteristics wherein propagation of electromagnetic energy from said channel region to other portions of said circuit board external to said channel region is reduced by the presence of said boundary regions.

2. The transmission line structure according to claim 1 wherein said at least one conductive metal trace and said substrate material are dimensioned for transverse electromagnetic wave propagation along said conductive metal trace at a selected frequency.

3. The transmission line structure according to claim 1 wherein a first permittivity of said substrate channel region is smaller as compared to a second permittivity of said dielectric substrate material surrounding said substrate channel region on an opposing side of said substrate boundary region.

4. The transmission line structure according to claim 1 further comprising a pair of said conductive metal traces disposed spaced apart and parallel to each other on said substrate channel region within said substrate boundary regions.

5. The transmission line structure according to claim 4 further comprising an intermediate substrate region disposed between said pair of conductive metal traces.

6. The transmission line structure according to claim 5 wherein said intermediate substrate region has a permittivity different as compared to a permittivity of said substrate channel region.

7. The transmission line structure according to claim 5 wherein said intermediate substrate region has a depth that extends through only a portion of a thickness of said circuit board on which said conductive metal traces are disposed.

8. The transmission line structure according to claim 5 wherein at least a portion of each of said conductive traces is respectively disposed on an opposing face of said intermediate substrate region.

* * * * *